United States Patent [19]

Moll et al.

[11] Patent Number: 4,641,450

[45] Date of Patent: Feb. 10, 1987

[54] TUBE HAVING STRAIN-HARDENED INSIDE COATING

[75] Inventors: Eberhard Moll, Schellenberg, Liechtenstein; Marcel Lardon, Maienfeld; Edgar Müller, Salez, both of Switzerland

[73] Assignee: Balzers Aktiengesellschaft, Fed. Rep. of Germany

[21] Appl. No.: 724,990

[22] Filed: Apr. 18, 1985

[30] Foreign Application Priority Data

Apr. 19, 1984 [CH] Switzerland ............... 1969/84

[51] Int. Cl.$^4$ .............. F41C 21/02; F41C 21/04; F41F 17/08
[52] U.S. Cl. ..................... 42/76.02; 89/16; 138/140; 138/153; 427/239; 428/36; 428/472; 428/698
[58] Field of Search ............ 42/76 A; 89/16; 427/238, 239; 428/36, 472, 698; 138/140, 145, 153

[56] References Cited

U.S. PATENT DOCUMENTS

| | | | |
|---|---|---|---|
| 2,541,116 | 2/1951 | Sames | 42/76 A |
| 2,792,657 | 5/1957 | Slowter | 42/76 A |
| 3,261,121 | 7/1966 | Eves | 42/76 A |
| 3,523,035 | 8/1970 | Whitlow | 42/76 A |
| 4,256,780 | 3/1981 | Gaerttner et al. | 427/251 |
| 4,419,202 | 12/1983 | Gibson | 427/238 |

OTHER PUBLICATIONS

Thornton et al., "Internal Stresses in Metallic Films Deposited by Cylindrical Magnetron Sputtering, *Thin Solid Films*, No. 64, 1979.
Hoffman et al., "Modification of Evaporated Chroinium by Concurrent Ion Bombardment", *J. Vac. Sci. Technol.*, vol. 17, No. 1, 1980.
Hoffman et al., "Compressive Stress and Inert Gas in Mo Films Sputtered From a Cylindrical-Post Magnetron with Ne, Ar, Kr, and Xe", *3. Vac. Sci. Techn.*, vol. 17, No. 1, 1980.
Thornton et al., "Internal Stresses in Titahium, Nickel, Molybdenum, and Tantalum Films Deposited by Cylindrical Magnetron Sputtering, *J. Vac. Sci. Technol.* vol. 14, No. 1, 1977.

*Primary Examiner*—Deborah L. Kyle
*Assistant Examiner*—Ted L. Parr
*Attorney, Agent, or Firm*—McGlew and Tuttle

[57] ABSTRACT

To manufacture tubes having a wear-resistant inside coating, such as gun barrels, hard material layers are deposited on the barrel and the layers are strain-hardened in their surface area by at least the ratio of the area by which the surface area is reduced by compression divided by the surface area of 0.001 ($\Delta F/F = 1.10^{-3}$) or reducing the area of the layer by 0.1%.

5 Claims, 1 Drawing Figure

TUBE HAVING STRAIN-HARDENED INSIDE COATING

FIELD AND BACKGROUND OF THE INVENTION

This invention relates in general to gun barrels and in particular to a new and useful method of forming the gun barrel and to the gun barrel construction.

The present invention relates to a tube, particularly a gun barrel having its inside surface coated with a thin layer of a hard material, to protect the inside surface against wear and corrosion and to reduce the friction and to a method of forming the barrel.

In order to improve the adhesion and resistance to abrasion of vacuum deposited layers, various measures have already been taken. For example, it is known that layers deposited by cathode sputtering adhere to certain surfaces better than layers applied by usual vapor deposition. An increased adhesion is also obtained with the recent methods of ion-assisted vapor deposition.

However, all of these prior art methods are of no use if such layers are exposed to a stronger and more frequent tensile load, as in the case of gun barrels during a discharge, for example.

Tubes with a coated inside surface are employed for most various purposes and while using most various methods of coating, such as sealing in (German OS 28 41 295 and 32 37 655), chemical precipitation from a gaseous phase (German OS 27 18 148), vapor deposition (U.S. Pat. No. 4,354,456 and 4,407,712), or cathode sputtering (German AS's 28 20 301; 26 55 942; 27 29 286; 31 50 591; German Pat. No. 976 529).

Coating of gun barrels is mentioned expressly only occasionally such as in Gipson (German Pat. No. 31 50 591), in connection with a cathode sputtering method, or in Koniger (German Pat. No. 25 37 623) and in Meistrung (German AS 28 09 709).

It would be advantageous to provide gun barrels with an inner coating of hard materials, to improve their resistance to wear and corrosion and reduce the friction. In spite of that, no successful coating of this kind is known up to the present time. The assumed reason is that the adhesion of the layer of hard material is not sufficient. This is a problem which evidently does not occur in the actually applied diffusion hardening where the interface problem does not arise.

German AS 28 09 709 describes an about 1.3 mm thick ceramic layer which is applied in a thermal spraying method to a core and then transferred from the core by shrinking there on a tube. A layer of such thickness, of course, has a high stability of its own and therefore does not depend merely on the adhesion to the substrate, as the layers considered have a thickness less than 10 micrometers (microns).

The mentioned ceramic layer is therefore rather an inserted ceramic tube which has been produced in a spraying process.

SUMMARY OF THE INVENTION

The present invention is directed to a tube of the above mentioned kind having an inner coating which does not peel off under operating conditions involving extension due to high pressures within the tube, and higher temperatures.

In accordance with the invention a tube such as a gun barrel is subject to high operating temperatures and comprising a tube which has an interior layer of material that is harder than the tube and is formed by subjecting the layer to a strain hardening in its surface area such that the ratio of which the surface area is reduced due to a straining or compression relative to the surface area, is $\Delta F/F = 1 \times 10^{-3}$.

In this expression, F is the surface area of the layer and $\Delta F$ the area by which the layer is reduced due to the straining or compression: $\Delta F/F = 1 \times 10^{-3}$ thus means that the area of the layer is reduced by 0.1%.

Surprisingly, it has been found that the strained layers applied inside the tube adhere firmly, even though layers of the same material applied in the same way but without straining during the application, later easily peel off under a tensile load. It may be assumed that due to the notches produced by cracking, the adhesion of a layer is strongly reduced under a frictional load such as occurring during a discharge in a gun barrel, for example.

As to the necessary degree of straining of the layer, it must be taken into account to what extent the tube will undergo deformation later in use. The straining percentage of the layer should at least be equal to, but better exceed, the percentage of extension suffered by the layer in use, to safely avoid cracking in the layer due to overstressing.

During the firing tests with gun barrels coated inside with different thin layers of hard material, it has surprisingly been found that an improved resistance to wear could in fact be obtained only if the layer was under a sufficiently strong compressive stress, namely, as mentioned, strained by at least $\Delta F/F = 1/1000$. This was contradictory to results obtained in hitherto made tearing tests in which thin layers under low stress have shown a better adhesion. Since the adhesion is substantially improved by the present invention, it may be inferred from these results that the limiting factor was not the adhesion itself of the layers.

The invention may advantageously be applied especially in instances where the layers forming the coating are not ductile enough themselves and tear even under a slight overextension.

A further object of the invention is to provide an improved method of forming a tube which is subjected to high temperatures such as a gun barrel which comprises forming a layer on the interior of the tube of a material harder than the tube and strain hardening the layer so that at the operating temperature of the tube the layer is strain hardened in the surface area by at least $\Delta F/F = 1 \times 10^{-3}$.

A further object of the invention is to provide such as a gun barrel having a high operating temperature which comprises a tube with an interior layer of material which is harder than the tube and is strain hardened so that the layer or layers are strain hardened in their surface area by at least the ratio of the area by which the surface area is reduced by compression divided by the surface area so that it equals $1 \times 10^{-3}$.

A further object of the invention is to provide a gun barrel which is simple in design, rugged in construction and economical to manufacture.

The various features of novelty which characterize the invention are pointed out with particularity in the claims annexed to and forming a part of this disclosure. For a better understanding of the invention, its operating advantages and specific objects attained by its uses, reference is made to the accompanying drawing and descriptive matter in which a preferred embodiment of the invention is illustrated.

DESCRIPTION OF THE PREFERRED EMBODIMENT

Figure 1:
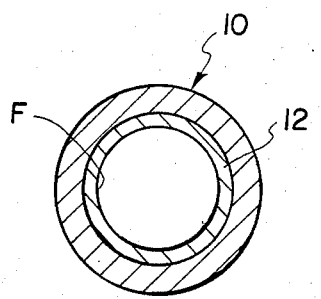
FIG. 1 of the drawing is a sectional view of a tube such as a gun barrel having a coating therein in accordance with the invention.

Referring to the drawing in particular as shown in FIG. 1, there is provided a gun barrel generally designated 10 which includes a tube member having an inner surface with an interior layer or layers 12 which are made of a material harder than the gun barrel 10. The surface area of the layer 10 is reduced by straining or compression such that the inner surface area F of the layer and the area by which the layer is reduced $\Delta F = 1 \times 10^{-3}$. This means that the area of the layer 12 is reduced by 0.1%.

The experimental results obtained in firing tests with barrels of the inventive design are in accordance with the following theoretical concept:

during a discharge, layers which are strained, or compressed by the indicated amount or more, are not stressed in tension by the occurring expansion of the barrel, they are rather relieved of the compressive stress caused by their initial straining. Due to this temporary relief, the adhesion of the layer is rather improved during the discharge. No breaks or cracks are produced in the layer as long as it is under compressive stress. This may substantially contribute to the stability of the layer.

Many methods are known of producing strained or compressed layers, such as needed for embodying the invention. With layer materials having a smaller coefficient of thermal expansion than the barrel, a straining of a layer may be effected by an increased temperature during the coating.

$$\Delta F/F = 2\Delta l/l = 2(\alpha_{substrate} - \alpha_{layer})\Delta T$$

However, experience has shown that in many instances, this prior art method of obtaining the needed straining of the layer, even though substantially effective, does not alone produce a satisfactory compressive stress. That is, the barrel must not be heated during the coating process to a high temperature which may reduce the hardness of the steel. For this reason, the coating temperatures are kept at about the tempering temperature of steel, for example 550° C. At the discharge, the barrel is heated up again and may reach temperatures at the location of the layer approximately equal to those during the coating. The simultaneous extension of the barrel then relieves the strain, as mentioned, and prevents the layer from cracking.

Recently, other vacuum coating methods have become known, in which the material of the layer is compressed by the effect of energy-bearing ions. In this connection, attention is drawn to the following references:

J. A. Thornton et al., Thin Solid Films 64 (1979) 111

J. A. Thornton et al., J. Vac. Sci. Technol. 14 (1977) 164

D. W. Hoffmann et al., J. Vac. Sci. Technol. 17 (1980) 380, 425

M. R. Gaertner et al., U.S. Pat. No. 4,256,780.

The layers may be applied with prior art methods and devices for coating insides of tubes. A device of this kind particularly suitable for coating under increased temperatures and ion bombardment is disclosed in the Swiss patent application No. 2544/83 (now U.S. Pat. No. 4,598,663 issue July 8, 1986 from Ser. No. 608,971).

Layers of titanium nitride, titanium carbide, titanium boride and tungsten carbide, for example, have been applied to the inside of barrels. Quite generally, borides, carbides and nitrides of the transition metals of the fourth and sixth group of the periodic table are suitable.

While applying layers in accordance with the invention, prior art measures improving the adhesion may be employed in addition. They include, for example, a good initial cleaning of the inside of the tube wall, a preliminary degassing by heating or electron bombardment, sputtering away of the uppermost layer by cathodic etching, applying a preliminary voltage during the layer deposition to the surface to be coated, etc.

The following methods of measuring the layer straining have been developed:

1. A rigid test body is initially provided with a chromium layer having a thickness somewhat exceeding that of the layer of hard material to be applied subsequently. The finish-coated test body is embedded in plastic and partially ground, to make the layers visible in cross section. The ground section surface is treated in 18% hydrochloric acid, to dissolve the chromium layer. Then, under the microscope, the chromium layer appears as a trench in which the separated layer of hard material extends in an undulatory way. From the amplitude and wavelength of the sinusoidal edge of the ground surface, the linear straining $\Delta l/l$ may be computed in a manner known per se. The straining value of the surface area is numerically double, $\Delta F/F = 2\Delta l/l$. Should the gap be too narrow, thus preventing a full relief of the hard material layer, a too small strain would be measured. However, since a straining larger than 1/1000 is claimed, this requirement can be met satisfactorily in spite of that.

2. A coated specimen is clamped on two opposite ends and is then slowly extended by force, until the hard material layer cracks. This may be detected, for example, with a microscope or a microphone, whereupon the extension $\Delta l/l$ is measured. Since the hard material layer is much more brittle than the steel, it may be assumed that the layer will crack already at a smallest extension. The measured extension is therefore equal to, or only insignificantly larger than, the straining.

3. On a coated sample, the hardness of the hard material layer is measured by a vickers-hardness testing method, under different loads. It will be found that with a load still above zero, the diamond seemingly no longer makes any imprint. This may best be ascertained by the fact that the variation of the square of the diagonal d of the impression, plotted as a function of the load p, results in a curve having for $2d = 0$ a positive, finite value $p^*$. By means of the methods described under 1 and 2 above, this measured value $p^*$ may be brought into relation with a definite straining of this layer.

While a specific embodiment of the invention has been shown and described in detail to illustrate the application of the principles of the invention, it will be understood that the invention may be embodied otherwise without departing from such principles.

What is claimed is:

1. A tube comprising, a tube member having an inner surface and an interior layer covering said interior surface, said interior layer itself having an inner surface, said interior layer being made of material which is harder than that of said tube member, and said tube member with said interior layer together being strain-hardened to reduce said inner surface of said interior layer at least by a factor of $\Delta F/F = 1 \times 10^{-3}$, $\Delta F$ being the amount of reduction of area for the inner surface of said interior layer and F being the total area of the inner surface of said interior layer.

2. A tube according to claim 1 wherein said tube member is made of steel and said interior surface is made of material selected from the group consisting of borides, carbides and nitrides of transition metals of the fourth and sixth group of the periodic table.

3. A tube according to claim 2 wherein said interior layer is made of material selected from the group consisting of titanium nitride, titanium carbide, titanium boride and tungsten carbide.

4. A method of manufacturing a tube having an interior layer with an inner surface comprising:
   providing a tube member having an inner tubular surface;
   applying an interior layer on the inner tubular surface, the interior layer being made of material which is harder than that of said tube member; and
   strain hardening the tube by reducing the area of the inner surface of the interior layer by a factor of at least $\Delta F/F = 1 \times 10^{-3}$ where $\Delta F$ is the amount of reduction of the area of the inside surface of the interior layer and F is the total area of the inner surface of the interior layer.

5. A method according to claim 4, including thermally tempering said tube at a tempering temperature and strain-hardening the tube by reducing the inner surface of the interior layer at the tempering temperature.

* * * * *